United States Patent [19]

Schlott et al.

[11] Patent Number: 5,480,532
[45] Date of Patent: Jan. 2, 1996

[54] SPUTTER TARGET FOR CATHODIC ATOMIZATION TO PRODUCE TRANSPARENT, CONDUCTIVE LAYERS

[75] Inventors: Martin Schlott, Hanau; Martin Kutzner, Neuberg; Martin Weigert, Hanau; Uwe Konietzka, Geiselbach, all of Germany; Bruce Gehman; Shawn Vahlstrom, both of Morgan Hill, Calif.

[73] Assignee: Leybold Materials, Hanau, Germany

[21] Appl. No.: 336,769

[22] Filed: Nov. 9, 1994

[30] Foreign Application Priority Data

Mar. 9, 1994 [DE] Germany .................. 44 07 774.2

[51] Int. Cl.⁶ .................. C23C 14/34; C04B 35/457
[52] U.S. Cl. .................. 204/298.13; 204/192.29; 501/134; 264/65
[58] Field of Search .................. 204/192.29, 298.13; 501/126, 134; 264/65

[56] References Cited

U.S. PATENT DOCUMENTS

| | | | |
|---|---|---|---|
| 4,456,549 | 6/1984 | Kano et al. | 252/518 |
| 4,647,548 | 3/1987 | Klein | 501/134 |
| 4,962,071 | 10/1990 | Bayard | 501/134 |
| 5,071,800 | 12/1991 | Iwamoto et al. | 501/126 |
| 5,094,787 | 3/1992 | Nakajima | 264/65 |
| 5,160,675 | 11/1992 | Iwamoto et al. | 264/56 |
| 5,401,701 | 3/1995 | Ogawa et al. | 501/134 |
| 5,433,901 | 7/1995 | Rancoule et al. | 264/28 |

FOREIGN PATENT DOCUMENTS

| | | | |
|---|---|---|---|
| 342537 | 11/1989 | European Pat. Off. | |
| 386932 | 9/1990 | European Pat. Off. | |
| 0584672 | 3/1994 | European Pat. Off. | 204/298.13 |
| 3738738 | 1/1989 | Germany . | |
| 4122908 | 2/1992 | Germany . | |
| 4124471 | 6/1992 | Germany . | |
| 60-211069 | 10/1985 | Japan | 204/298.13 |
| 1-65203 | 3/1989 | Japan . | |
| 3-44465 | 2/1991 | Japan . | |
| 3-126655 | 5/1991 | Japan . | |
| 4-104936 | 4/1992 | Japan . | |
| 5-112866 | 5/1993 | Japan | 204/298.13 |
| 5-247636 | 9/1993 | Japan | 204/298.13 |
| 5-311422 | 11/1993 | Japan | 204/298.13 |
| 5-311428 | 11/1993 | Japan | 204/298.13 |

OTHER PUBLICATIONS

Hofer, B. Anwendung des HIP–verfahrens bei keramischen wenkstoffen, Keramische Zeitschrift, 36. Jg, Nr. 7, 1984, pp. 352–354.

*Primary Examiner*—Aaron Weisstuch
*Attorney, Agent, or Firm*—Felfe & Lynch

[57] ABSTRACT

A target for production of transparent electrically conductive layers by cathode sputtering is produced from indium oxide-tin oxide powder mixtures or coprecipitated indium oxide-tin oxide powders. A target with especially high mechanical strength consists of an oxide ceramic material into which metallic phase components have been incorporated in a uniform and finely distributed manner and which has a density of more than 96% of the theoretical density of indium oxide/tin oxide consisting purely of oxide.

5 Claims, No Drawings

SPUTTER TARGET FOR CATHODIC ATOMIZATION TO PRODUCE TRANSPARENT, CONDUCTIVE LAYERS

BACKGROUND OF THE INVENTION

The invention pertains to a sputter target for cathodic atomization to produce transparent, electrically conductive layers, the target being produced from partially reduced indium oxide-tin oxide powder mixtures or partially reduced co-precipitated indium oxide-tin oxide powders, and to a process for the production of these targets.

Oxide ceramic targets of indium oxide-tin oxide (ITO) are used for the production of thin, transparent, electrically conductive layers by cathodic atomization (sputtering). These layers are used in particular in flat screen imaging technology. The thin indium oxide-tin oxide layers can be produced either by the sputtering of metal targets in a reactive oxygen-containing atmosphere or by the sputtering of oxide ceramic targets.

The sputtering process with oxide ceramic targets has the advantage that the oxygen flow rate in the sputtering chamber is slow, and this makes it easier to control the sputtering process than when sputtering is carried out with metal targets, which requires a high oxygen flow rate.

Because indium oxide/tin oxide is a ceramic material, a critical problem in fabricating the targets is how to make the appropriate powders into sputtering targets which are free of cracks and have sufficient mechanical strength. Otherwise, there is the danger that the target plates will crack apart during final processing or that areas will chip off at the edges. The thermal loads during sputtering operations can also lead to cracks in the target if the ITO material is not strong enough or has insufficient resistance to alternating temperatures.

Another demand to be met consists in that it is necessary to produce targets of high density, because the results of sputtering processes have shown that denser targets offer advantages with respect to the sputtering rate and have less of a tendency to develop black spots. The latter advantage is especially important, because it guarantees trouble-free, continuous operation of the target and of the sputtering system.

Partially reduced indium oxide-tin oxide targets and their production are described in U.S. Pat. No. 4,647,548. According to this publication, indium oxide-tin oxide powder mixtures are hot-pressed under reducing conditions at 850°–1,000° C.; the oxides can be hot-pressed either in a graphite hot-press mold or in a mold to which carbon or carbon-releasing organic material has been added. During pressing, the oxides are partially reduced, so that a target is formed which contains less oxygen than that called for by the stoichiometry of the composition.

By means of this process, however, the only targets which can be produced are those with densities of <91% of the theoretical density (TD), poor electrical resistivity ($\rho$= 0.1–0.6 $\Omega$Pcm), and insufficient mechanical strength. All three factors have negative effects on the use of the sputtering target.

A process for the production of partially reduced ITO targets by the use of a pre-reduced ITO powder followed by hot-pressing is described in DE 41 24 471. The task of this prior process was to produce ITO targets with a degree of reduction which varied by less than 5% by compacting highly homogeneous, reduced powder by hot-pressing to form target disks.

Studies have shown, however, that, unless the morphology of the partially reduced powder is favorable, very poor results will be obtained with respect to target density and the mechanical strength of the target disks.

SUMMARY OF THE INVENTION

The task of the present invention is to avoid the disadvantages of the known target materials and to create an oxide ceramic target of high mechanical strength.

According to the invention, the target is formed of an oxide ceramic matrix into which metal phase components of In and/or Sn which are less than 50 µm in size have been incorporated in a uniform and finely distributed manner and which has a density of more than 96% of the theoretical density of indium oxide/tin oxide consisting purely of oxide. By means of the invention, it is possible to process the target mechanically without problem; to achieve high sputtering rates with the target; and to obtain a target which has only a slight tendency to form black spots.

The surprising discovery was made that, by the hot isostatic pressing of suitable, partially reduced powder mixtures of indium oxide and tin oxide or corresponding partially reduced co-precipitated powders, extremely dense target materials characterized by excellent fracture toughness can be produced. The achieved density is at least 96% of the theoretical density, and the fracture toughness is at least 1.5 MPa√m. In comparison, the hot-pressing of unreduced ITO powder leads to only 89% of the theoretical density and to fracture toughnesses of no more than 1.1 MPa√m. The ITO targets produced according to the invention are characterized by a structure which, in addition to the matrix of indium oxide and tin oxide, also contains finely distributed metallic phases. The size of the metal phases is in the range of <50 µm, most of the phases being smaller than 10 µm. If weakly reduced ITO powder is used, the metallic components consist primarily of tin. In the case of highly reduced powders, a mixture or alloy of indium and tin is present.

Structural studies of ITO targets produced by different methods have shown that the presence of the above-mentioned finely distributed metallic phases apparently leads to better compaction and to a significant degree of recrystallization of the matrix of indium oxide/tin oxide during hot isostatic pressing. This result is surprising, because, under normal conditions, the metals indium and tin are not observed to wet indium oxide/tin oxide, and therefore one would not have expected any positive effect from the liquid phases during compaction. In addition to a greater density, a much more fracture-resistant structure is also produced by the observed recrystallization. This, too, is an unexpected result, because, as a rule, better mechanical properties are obtained in ceramic materials when the grain size is decreased. Studies of the fracture surfaces suggest that, as a result of the recrystallization, what is achieved is primarily an improvement of the adhesion between the individual oxide particles. It has also been observed that the metallic phases assume a crack-stopping function.

During the course of the development work, it was found that good targets were obtained especially when the degree of reduction of the powder, defined as the oxygen loss during the reducing treatment with respect to the oxygen content of the pure oxide powder, is in the range of 0.02–0.2. If the degree of reduction is any lower, there is not enough metallic phase present to achieve the positive effects on compaction and strength. If the degree of reduction is higher, the strength values decrease because of the excessively large and frequent segregations of metal. In addition, a target such as this is also less suitable for the production of good ITO layers, because it will now be necessary to use a very high oxygen flow rate. To obtain powders which have an advantageous structure in accordance with the present invention, the reducing process must be conducted in such a way that finely distributed and very small metal segregations (size, <50 μm, preferably even <10 μm) are obtained. If the metal particles are too large, they have a negative effect on strength, because they act as microscopic defects in the structure. Preferably the pure oxide ITO powder is subjected to an annealing treatment in a reducing gas atmosphere, but annealing under vacuum or the admixture of reducing solids is also possible. In the latter case, however, reduction is associated with strong local concentrations, which usually lead to numerous metal particles with a size of considerably more than 50 μm, so that the targets produced from this powder appear spotted and have inferior fracture toughness values. For the same reason, the reducing treatment should also be carried out at temperatures below 1,000° C., preferably below 800° C. The subsequent compaction of the partially reduced powder or a basic shape produced therefrom is carried out by way of hot isostatic pressing in a lined, vacuum-tight, welded compaction can at a temperature above the melting point of the indium-tin metal phases.

The following examples are intended to explain the targets according to the invention and the method used to produce them in greater detail:

1. EXAMPLE ACCORDING TO THE PRESENT INVENTION

A mixture of 900 g of indium oxide and 100 g of tin oxide was annealed for 45 minutes at 720° C. in a $N_2/H_2$ atmosphere (95/5). The oxygen loss of the sample was 15.20 g, corresponding to a degree of reduction of 0.086. Scanning-electron micrographs of the powder showed spherical metal phases 1–10 μm in size, the tin content of which was over 90 wt.%. 600 g of the mixture was subjected to cold isostatic pre-pressing to form a cylinder and then compacted in a hot isostatic press in a lined steel can at 800° C. and 200 MPa. After removal, the indium oxide tin-oxide body had a diameter of 80 mm and a thickness of 16.5 mm, corresponding to 98.5% of the theoretical density. The specific (electrical) resistance of the target was 380 μΩPcm, and the fracture toughness was 1.6 MPa√m. Mechanical processing could be completed without difficulty. During the sputtering test, no arcing was observed, and very good sputtering rates were achieved. In comparison with the grain size of the powder used, a significant amount of grain growth was evident, which proceeded from the finely distributed metal phases. As in the powder, the size of the metal segregations was in the range of 1–10 μm; in individual cases, metal regions up to 20 μm in size were found.

2. COMPARISON EXAMPLE

A pure oxide indium oxide/tin oxide powder mixture was first pre-pressed under cold isostatic conditions as described in Example 1 and then compacted in a hot isostatic press in a lined steel can at 750° C. and 200 MPa. The cylinder thus obtained showed cracks and could not be processed any further to obtain targets. Scanning-electron micrographs of the material showed an unrecrystallized structure with the original grain size. No metallic segregations were observed.

3. EXAMPLE CORRESPONDING TO THE PRESENT INVENTION 1,000 g of a co-precipitated indium oxide/tin oxide powder (90/10 wt.%) was annealed at 420° C. for 1 hour in a hydrogen atmosphere.

The oxygen loss of the sample was 30.1 g, corresponding to a degree of reduction of 0.17. Scanning-electron micrographs of the powder showed spherical metal phases 1–10 μm in size, which consisted of approximately equal parts of indium and tin. 600 g of the powder was pre-pressed under cold isostatic conditions to form a cylinder and then compacted in a lined steel can at 750° C. and 200 MPa in a hot isostatic press. After removal, the indium oxide-tin oxide body had a diameter of 80 mm and a thickness of 17.2 mm, corresponding to 97% of the theoretical density. The specific resistance was 320 μΩPcm, and the fracture toughness was 1.9 MPa√m. Mechanical processing could be completed without incident. During the sputtering test, no arcing was observed, and very good sputtering rates were achieved. After the test, the target was nearly free of black spots. The target was subjected to metallographic study. In comparison with the grain size of the original powder, a significant amount of grain growth was evident, which proceeded from the finely distributed metal phases. The size of the metal precipitations was 1–10 μm, and scattered areas of metal up to 30 μm in size were found.

4. COMPARISON EXAMPLE

A mixture of 900 g of indium oxide and 100 g of tin oxide was mixed with 0.1 g of carbon powder and then annealed for 1.5 hours at 880° C. under argon.

The oxygen loss of the sample was 7.9 g, corresponding to a degree of reduction of 0.045. Scanning-electron micrographs of the powder showed metal particles up to 200 μm in size. 800 g of this powder was compacted as described in Example 1. The resulting cylinder had a diameter of 85 mm and a height of 20.4 mm, corresponding to 96.5% of the theoretical density. The specific resistance of the target was 350 μΩPcm, and the fracture toughness was 1.3 MPa√m. Mechanical processing had to be carried out very cautiously because of the low resistance of the material to fracture. The target obtained had a spotty surface because of the metal precipitations. During the sputtering test, arcing occurred occasionally, so that the maximum power density could not be achieved. The target was subjected to metallographic study. In comparison with the grain size of the original powder, a considerable amount of grain growth was evident, which was more pronounced in the surroundings of the metal precipitations over 100 μm in size than in the areas without these large metal phases. Overall, the structure was therefore highly inhomogeneous.

5. COMPARISON EXAMPLE 300 g of a mixture of 900 g of indium oxide and 100 g of tin oxide was added directly, i.e., without a reducing treatment, to a graphite hot-pressing mold coated with boron nitride with a diameter of 80 mm and compacted at 870° C. under an argon atmosphere at a maximum pressing force of 20 MPa. The resulting disk had a thickness of 9.4 mm, corresponding to a density of 80% of the theoretical value. The specific resistance of the target was 3,600 μΩPcm, and the fracture toughness was 1.1 MPa√m. During final mechanical processing, some chipping occurred at the edges of the disk. During the sputtering test, arcing was observed repeatedly. The achieved sputtering rates were about 15% below the rates which were obtained with targets corresponding to the present invention. After the sputtering test, the target showed numerous small black spots. The metallographic study of the target showed no significant amount of metallic phases and no signs of recrystallization, except in a superficial reaction space.

What is claimed is:

1. Target for production of transparent electrically conductive coatings by cathode sputtering, said target consisting of
    a matrix of indium oxide and tin oxide, said matrix having a theoretical density if consisting purely of said oxides, and
    metallic phase components consisting of at least one of indium and tin, said components being less than 50 μm in size and distributed uniformly throughout said matrix, said target having a density of at least 96% of said theoretical density.

2. Target as in claim 1 wherein substantially all of said metal phase components are less than 10 μm in size.

3. Target as in claim 1 wherein said target has a fracture toughness of at least 1.5 MPa√/m.

4. Process for production of a target for production of transparent electrically conductive coatings by cathode sputtering, said process comprising
    providing a powder consisting of one of a mixture of indium oxide and tin oxide and co-precipitated indium oxide and tin oxide,
    annealing said powder at temperatures below 1000° C. in a reducing gas atmosphere so that metallic phase components of indium and tin less than 50 μm in size are formed uniformly throughout said powder, and
    hot isostatic pressing said powder at temperatures above the melting points of said metallic phase components.

5. Process as in claim 4 wherein said annealing is performed so that metallic phase components less than 10 μm in size are formed.

* * * * *